(12) United States Patent
Smith et al.

(10) Patent No.: US 10,225,964 B2
(45) Date of Patent: Mar. 5, 2019

(54) COMPONENT SHIELDING STRUCTURES WITH MAGNETIC SHIELDING

(71) Applicant: Apple Inc., Cupertino, CA (US)

(72) Inventors: James B. Smith, Los Gatos, CA (US); Daniel W. Jarvis, Sunnyvale, CA (US); David A. Pakula, San Francisco, CA (US); Gregory N. Stephens, Sunnyvale, CA (US); Nicholas G. L. Merz, San Francisco, CA (US); Shayan Malek, San Jose, CA (US); Sina Bigdeli, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/250,066

(22) Filed: Aug. 29, 2016

(65) Prior Publication Data

US 2017/0290207 A1   Oct. 5, 2017

Related U.S. Application Data

(60) Provisional application No. 62/316,436, filed on Mar. 31, 2016.

(51) Int. Cl.
*H05K 9/00* (2006.01)
*H05K 1/18* (2006.01)
*H01L 23/552* (2006.01)

(52) U.S. Cl.
CPC ........... *H05K 9/003* (2013.01); *H01L 23/552* (2013.01); *H05K 1/18* (2013.01); *H05K 9/0088* (2013.01)

(58) Field of Classification Search
CPC .. H05K 9/0022; H05K 9/0024; H05K 9/0026; H05K 9/0052; H05K 9/0073;
(Continued)

(56) References Cited

U.S. PATENT DOCUMENTS 5,639,014 A * 6/1997 Damiano ................ H01L 23/04
228/170
8,021,042 B1 * 9/2011 Aslan ..................... G01K 7/015
327/512
(Continued)

FOREIGN PATENT DOCUMENTS

CN   102651963 A   8/2012
CN   102742377 A   10/2012
(Continued)

OTHER PUBLICATIONS

MUMetal Sheilding Cans, Magnetic Shield Corporation, Perfection Mica Company, Bensenville, IL, USA.

*Primary Examiner* — Hoa C Nguyen
(74) *Attorney, Agent, or Firm* — Treyz Law Group, P.C.; G. Victor Treyz; David K. Cole

(57) ABSTRACT

Electrical components may be shielded using a shielding can or other shielding structure that covers the electrical components. The electrical components and the shielding structure may be mounted on a substrate such as a printed circuit board using solder or other conductive material. The shielding structure may have one or more shielding layers. The shielding layers may include high conductivity material for providing shielding for radio-frequency electromagnetic interference and magnetic material for blocking magnetic flux. Shielding structures may be formed from materials such as ferritic stainless steel, coatings that enhance solderability, corrosion resistance, and conductivity, magnetic materials printed or otherwise formed on metal layers, and other shielding structures.

20 Claims, 7 Drawing Sheets

(58) Field of Classification Search
CPC .. H05K 9/0075; H05K 9/0081; H05K 9/0088; H01F 1/00; H01F 23/552; H01F 2017/0073; H01F 27/288; H01F 27/2885; H01F 27/346; H01F 27/365
See application file for complete search history.

(56) References Cited

U.S. PATENT DOCUMENTS

| | | | |
|---|---|---|---|
| 8,664,751 B2* | 3/2014 | Kim | H01L 23/552 |
| | | | 257/659 |
| 9,269,673 B1* | 2/2016 | Lin | H01L 24/97 |
| 2004/0001299 A1* | 1/2004 | van Haaster | G02B 6/4277 |
| | | | 361/118 |
| 2006/0180880 A1 | 8/2006 | Wang et al. | |
| 2011/0272189 A1 | 11/2011 | Chen et al. | |
| 2013/0105950 A1 | 5/2013 | Bergemont et al. | |
| 2015/0156930 A1* | 6/2015 | Huang | H05K 9/0088 |
| | | | 428/596 |
| 2015/0271911 A1 | 9/2015 | Chen et al. | |
| 2015/0271959 A1 | 9/2015 | Chen et al. | |
| 2016/0057897 A1* | 2/2016 | Malek | H05K 9/0024 |
| | | | 361/752 |

FOREIGN PATENT DOCUMENTS

| | | |
|---|---|---|
| CN | 103298323 A | 9/2013 |
| CN | 104219940 A | 12/2014 |
| CN | 105307465 A | 2/2016 |

* cited by examiner

COMPONENT SHIELDING STRUCTURES WITH MAGNETIC SHIELDING

This application claims the benefit of and claims priority to provisional patent application No. 62/316,436, filed Mar. 31, 2016, which is hereby incorporated by reference herein in its entirety.

FIELD

This relates generally to shielding and, more particularly, shielding structures such as shielding cans that provide magnetic and radio-frequency electromagnetic interference shielding.

BACKGROUND

Electronic equipment often contains components that are subject to signal interference. Metal shield cans may be used to cover integrated circuits and other components and thereby help to suppress electromagnetic interference. Shield cans of this type can be formed from materials such as copper that suppress signals at radio frequencies and may sometimes be referred to as radio-frequency shields.

Magnetic materials may be used to form shield cans that help suppress magnetic fields at lower frequencies. An example of a magnetic material that can be used in forming magnetic shielding cans is the high permeability nickel-iron magnetic alloy that is sometimes referred to as mu-metal.

To add magnetic shielding capabilities to metal radio-frequency shielding cans, a layer of mu-metal material may be attached to the surface of a metal radio-frequency shielding can with adhesive, but this type of arrangement may add undesirable bulk, can adversely affect reliability because magnetic material layers can separate from underlying radio-frequency shield cans, and can add to assembly cost and complexity.

SUMMARY

Electrical components may be shielded using a shielding can or other shielding structure that covers the electrical components. The electrical components and the shielding structure may be mounted on a substrate such as a printed circuit board using solder or other conductive material.

The shielding structure may have walls formed from one or more shielding layers. The shielding layers may include high conductivity material for providing shielding for radio-frequency electromagnetic interference and magnetic material for blocking magnetic flux. In some configurations, shielding may be provided using a single layer that serves both as a radio-frequency interference shield and as a magnetic shield. In multilayer configurations, cold-rolling techniques, stamping processes, electroplating and other coating techniques, and other methods for joining multiple layers of material together may be used to form shield can walls.

Shielding structures may be formed from materials such as stainless steel, layers that enhance solderability, corrosion resistance, and conductivity, magnetic materials that are printed or otherwise formed on underlying metal layers, and other shielding structures.

DETAILED DESCRIPTION

Electronic devices may be provided with electrical components such as integrated circuits, discrete electrical components such as inductors, capacitors, and resistors, and other electrical components. Shielding may be used to prevent interference between components. The shielding block radio-frequency signals and magnetic fields. Shielding structures may be formed into the shape of shielding cans and may serve as cowlings.

Figure 1:
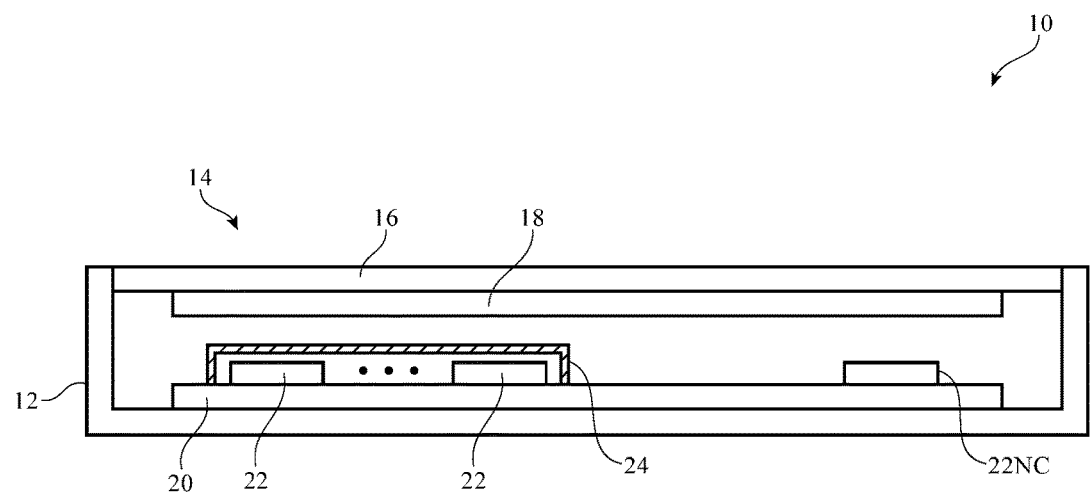
FIG. 1 is a cross-sectional side view of an illustrative electronic device in accordance with an embodiment.

A cross-sectional side view of an illustrative electronic device of the type that may include shielded electrical components is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

As shown in FIG. 1, device 10 may include components such as display 14. Display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may be protected using a display cover layer such as display cover layer 16. A liquid crystal display module, organic light-emitting diode display, or other display structures (shown as display module 18 in the example of FIG. 1) may be mounted below display cover layer 16. In some configurations for device 10, display 14 may be omitted. The arrangement of FIG. 1 in which device 10 includes display 14 is merely illustrative.

As shown in the cross-sectional side view of electronic device 10 of FIG. 1, electronic device 10 may include internal electrical components such as electrical components 22. Electrical components 22 may include sensors, integrated circuits, buttons, connectors, discrete components such as inductors, capacitors, and resistors, and other circuitry. If desired, one or more of electrical components 22 may be a system-in-package (SiP) device. A component formed using system-in-package technology includes multiple integrated circuits packaged in a common package.

In the interior of electronic device 10, electrical components 22 may be mounted on one or more substrates such as substrate 20. Substrate 20 may be a dielectric carrier such as a molded plastic carrier, a ceramic substrate, or a printed circuit. For example, substrate 20 may be a printed circuit such as a rigid printed circuit formed from a material such as fiberglass-filled epoxy or may be a flexible printed circuit formed from a sheet of polyimide or other flexible polymer layer.

To block radio-frequency electromagnetic signal interference (EMI) and magnetic fields, electrical components 22 may be covered with shields such as shield 24. Shield 24 may have the shape of a shielding can with a top and four sides or other suitable shape, may serve as a cowling, bracket, or other part that helps to hold portions of device 10 together while shielding electrical components 22, or may be formed from other suitable shielding structures.

Shields such as shield 24 may cover one or more electrical components 22. If desired, some of the electrical components on substrate 20 may be uncovered by shielding structures (see, e.g., unshielded electrical component 22NC). Shield 24 may be coupled to metal traces (e.g., grounding traces) on substrate 20 using solder, welds, conductive adhesive, screws or other fasteners, or other conductive attachment structures. Shields 24 may be used to cover aggressor components and thereby block the emission of interfering signals and may be used to cover sensitive (victim) components and thereby prevent interference from disrupting those components.

Figure 2:
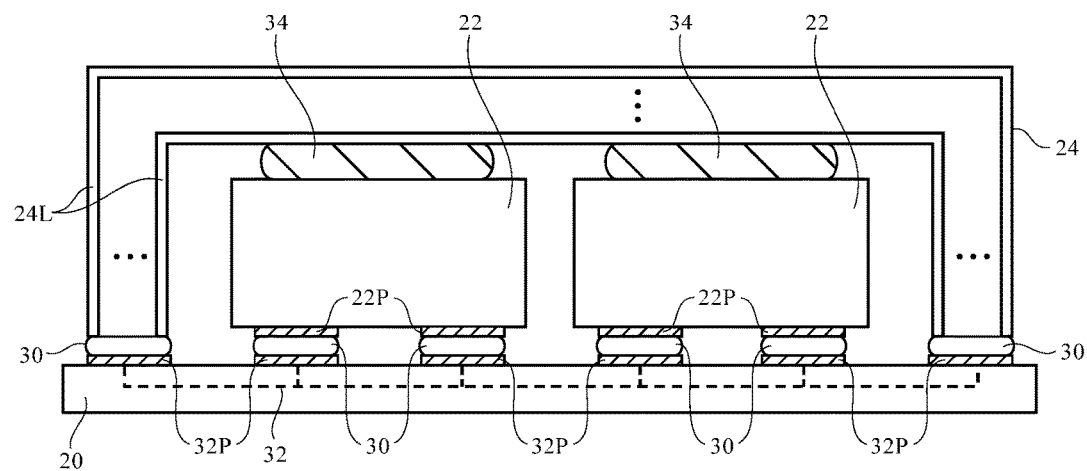
FIG. 2 is a cross-sectional side view of a portion of an illustrative printed circuit board populated with electrical components that are shielded by a shield in accordance with an embodiment.

A cross-sectional side view of an illustrative set of components 22 that have been covered by a shield such as shield 24 is shown in FIG. 2. As illustrated by the shielded circuitry of FIG. 2, components 22 and shield 24 may be mounted to substrate 20 using conductive material such as solder 30.

Substrate 20 may be a printed circuit or other substrate that includes one or more layers of signal interconnects 32 (e.g., one or more layers of patterned metal traces). Interconnects 32 may include contacts such as solder pads 32P. Pads 32P may be formed on the upper surface of substrate 20 (as an example). Contacts formed from interconnects 32 may also be located on the lower surface of substrate 20 (e.g., to facilitate mounting of electrical components 22 and additional shields such as shield 24 to the lower surface printed circuit 20). Pads 32P and other interconnects 32 may be used to couple shield 24 to ground, may be used to route data between electrical components 22, may be used to distribute power supply signals and other signals, etc.

Electrical components 22 may have contacts such as solder pads 22P that mate with contacts 32P on the upper surface of printed circuit 20. A soldering tool or other equipment may use solder 30 or other conductive material (e.g., conductive adhesive, etc.) to mount electrical components 22 and one or more shields such as shield 24 to pads 32P on substrate 20. After integrated circuits and other electrical components 22 have been mounted to substrate 20, components 22 may, if desired, be covered with thermally conductive material 34 such as thermal compound (thermal grease), thermally conductive foam, or other thermally conductive material. Thermally conductive material 34 may help promote heat transfer away from components 22 through shield 24 (e.g., to a heat sink, to a region with flowing air, etc.).

Shield 24 may have one or more layers of material such as layers 24L. To provide components 22 with satisfactory electromagnetic shielding, shield 24 may contain conductive materials (e.g., to block electromagnetic interference at radio frequencies) and/or magnetic materials (to block magnetic flux). As an example, metals and other materials that form shield 24 may exhibit high conductivity and high permeability. The resistivity of a high-conductivity metal of the type that may be used in shield 24 to provide shield 24 with radio-frequency shielding capabilities may be less than $2 \times 10^{-8}$ ohm-m, less than $3 \times 10^{-8}$ ohm-m, less than $10 \times 10^{-8}$ ohm-m, or other suitable amount. The relative permeability of the layer(s) of magnetic material in layer 40 and/or layer 31 may be 500 or more, may be 2000 or more, may be 5000 or more, may be 10,000 or more, may be 20,000 or more, may be 80,000 or more, may be 5,000-100,000, may be 50,000-100,000, be less than 100,000, or may have any other suitable value that allows material to serve as magnetic shielding for components 22. Layers 40L may include one or more layers that primarily provide magnetic shielding, one or more layers that primarily provide radio-frequency electromagnetic shielding, one or more layers that serve both as magnetic shielding and as radio-frequency shielding, and one or more layers that provide shield 24 with other desirable attributes (solderability, corrosion resistance, heat transfer capabilities, enhanced conductivity, etc.).

Figure 3:
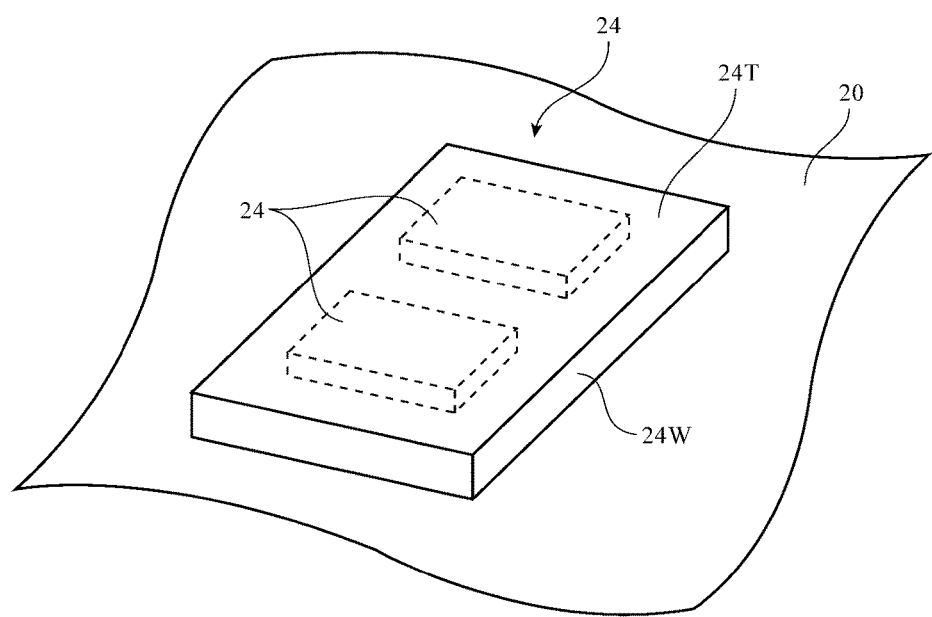
FIG. 3 is a perspective view of an illustrative shield can in accordance with an embodiment.

Shield 24 may have any suitable shape such as a square shape, a rectangular shape, a shape with an irregular outline, a shape with multiple different heights above substrate 20, a shape with curved edges, and/or other suitable shapes). As shown in the perspective view of the illustrative shield 24 of FIG. 3, shield 24 may, if desired, have the shape of a shield can with a planar top surface 24T and vertical sidewalls 24W. With this type of arrangement, the shield can may have the shape of an open-bottomed box that can be mounted on substrate 20 to enclose one or more electrical components 22 mounted on substrate 20. Shield cans with other shapes may also be used to shield components 22.

Figure 4:
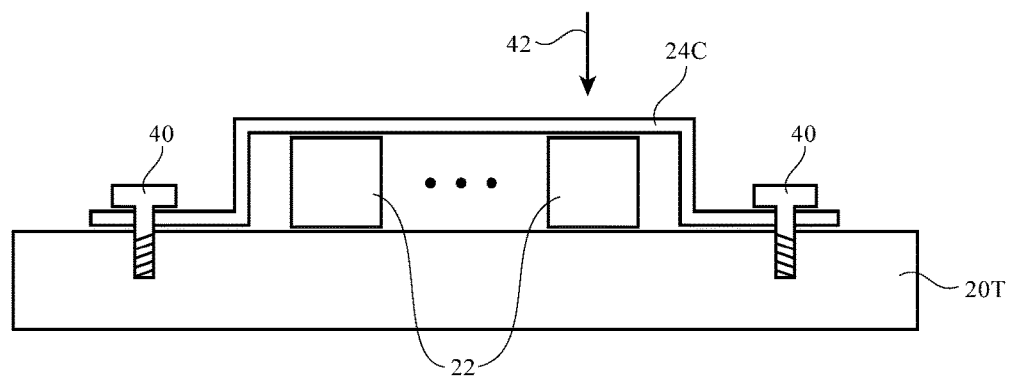
FIG. 4 is a cross-sectional side view of a shielding structure such as a shield can or cowling with shielding materials in accordance with an embodiment.

If desired, device 10 may have mechanical structures such as brackets, clamps, and frame structures, and other structures that help attach portions of device 10 together or that serve other mechanical functions. The materials of shield 24 such as layers 24L of FIG. 2 may, if desired, be incorporated into a cowling structure that helps hold connectors, integrated circuits, or other electrical components in place on a printed circuit board or other substrate. FIG. 4 is a cross-sectional side view of an illustrative cowling of the type that may be formed from materials that allow the cowling to serve as a shield. As shown in FIG. 4, cowling 24C may overlap components 22 and may press downward on components 22 to help hold components 22 in place on support structure 20T. Support structure 20T may be a substrate such as a printed circuit, may be a metal bracket, a housing wall, an internal housing member, a ceramic or plastic member, or other suitable structure in device 10. In the example of FIG. 4, screws 40 have threads that engage mating threads in support structure 20T and thereby secure cowling 24C in place on structure 20T. This is merely illustrative. Cowling 24C may be mounted on structure 20T using any suitable attachment mechanisms (solder joints, welds, adhesive, fasteners other than screws, etc.). Cowling 24C may include one or more layers such as layers 24L of FIG. 2 so that cowling 24C may serve as a shield for components 22 that are covered by cowling 24C. In general, any suitable structures may be used to provide components 22 with shielding. The use of cowling 24C of FIG. 4 is merely illustrative. Configurations in which components 22 are shielded using a shield structure such as shield 24 of FIG. 3 may sometimes be described herein as an example.

In configurations in which shield 24 is formed from a single layer of material, it may be desirable to form shield 24 from a material that has both radio-frequency and magnetic shielding capabilities while offering suitable corrosion resistance and solderability. With one illustrative arrangement, shield 24 may be formed from a stainless steel such as 444 stainless steel or 430 stainless steel (e.g., stainless steel with a relative permeability of 600-1100 or more), or other stainless steels (e.g., other 400 series stainless steels, other stainless steels with relative permeabilities of 500 or more, 600 or more, 1000 or more, etc.). Stainless steels such as these may exhibit both satisfactory conductivity (e.g., resistance less than $65 \times 10^{-8}$ ohm-m, less than less than $2 \times 10^{-8}$ ohm-m, less than $3 \times 10^{-8}$ ohm-m, less than $10 \times 10^{-8}$ ohm-m, or other suitable amount) and satisfactory magnetic permeability (e.g., a relative permeability of 500 or more, 600 or more, 1000 or more, etc.).

If desired, layers 20L may include one or more layers such as a pair of outer layers that exhibit good solderability and corrosion resistance (and, if desired, enhanced conductivity for radio-frequency shielding) and one or more inner layers such as stainless steel that can serve as radio-frequency and magnetic shielding. As an example, a layer of stainless steel (e.g., 430 stainless, 444 stainless, other stainless steel, etc.) may be incorporated into shield 24 between a pair of layers of corrosion resistant metal or metal alloy material (e.g., nickel or an alloy such as copper-nickel) using a cold rolling process.

Figure 5:
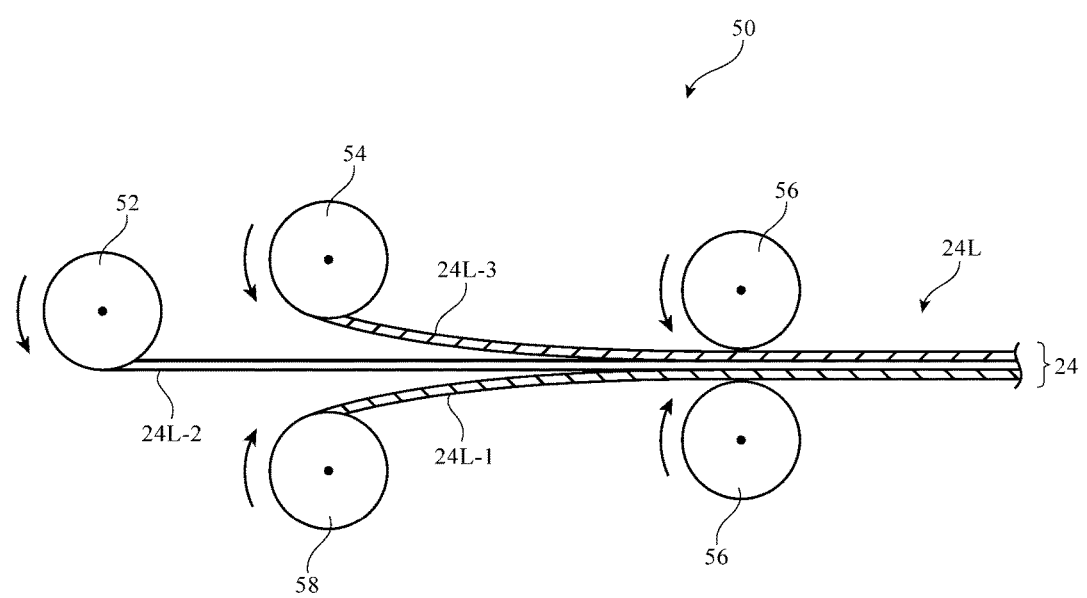
FIG. 5 is a diagram of illustrative equipment for cold rolling a multilayer structure for a shield in accordance with an embodiment.

Illustrative cold rolling equipment is shown in FIG. 5. As shown in FIG. 5, cold rolling equipment 50 may include rollers such dispensing rollers 52, 54, and 58 and compression rollers such as rollers 56. Roller 52 may dispense inner layer 24L-2. Rollers 58 and 54 may respectively dispense outer layers 24L-1 and 24L-3. Inner layer 24L-2 may serve as radio-frequency shielding and/or magnetic shielding. Layer 24L-2 may be, for example, stainless steel such as 444 stainless steel, 430 stainless steel (e.g., stainless steel with a relative permeability of 600-1100 or more), or other stainless steels (e.g., other 400 series stainless steels, other stainless steels with relative permeabilities of 500 or more, 600 or more, 1000 or more, etc.). Outer layers 24L-1 and 24L-3 serve as cladding and may help provide layer 24L-2 with enhanced corrosion resistance and/or enhanced solderability. Layers 24L-1 and 24L-3 may be, for example, layers of nickel or layers of copper-nickel (e.g., 90-70% copper and 10-30% nickel, etc.). Other materials may be used for outer layers 24L-1 and 24L-3 and other materials may be used for inner layer 24L-2, if desired.

As part of a cold rolling process, rollers 56 may compress layers 24L-1, 24L-2, and 24L-3 together to from combined layers 24L of shield 24. After compression (and, if desired, annealing), layers 24L-1 and 24L-3 (e.g., layers of gold, copper-nickel, nickel, silver, or other materials) serve as cladding layers on opposing sides of layer 24L-2 (e.g., a magnetic shielding material layer). If desired, stamping, laser cutting, machining, and/or other cutting and shaping techniques may be used to form cold-rolled layers 24L of FIG. 5 into a desired shield structure (e.g., shielding can 24 of FIG. 3, cowling 24C of FIG. 4, etc.). Cold rolling techniques may be used to produce continuous rolls of clad stainless steel shielding material or may be used to produce discrete sections of shielding material with desired cladding layers.

Figure 6A:
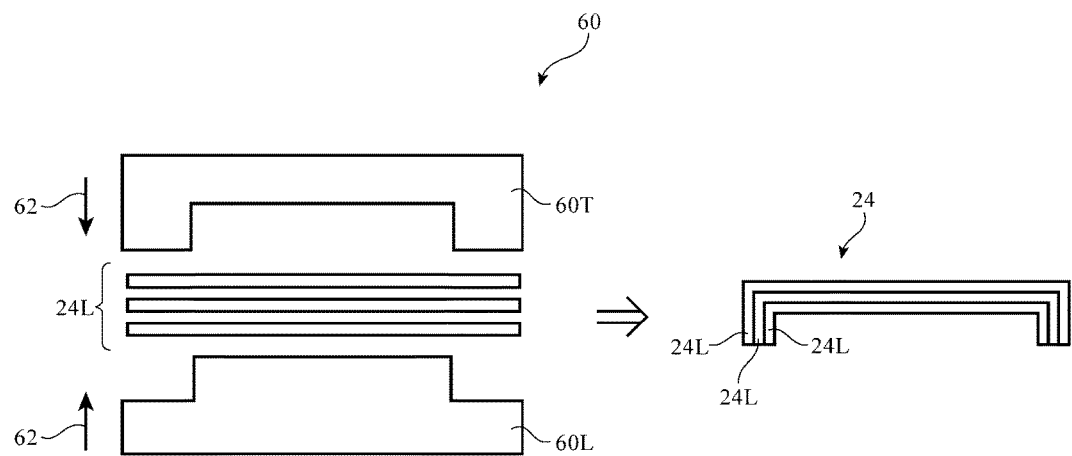
FIG. 6A is a diagram showing how dies or other shaping equipment may be used to form one or more shielding layers into a shield of a desired shape in accordance with an embodiment.
Figure 6B:
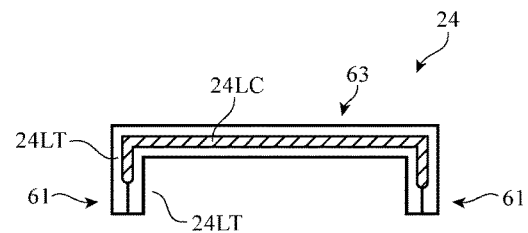
FIG. 6B is a cross-sectional side view of an illustrative shield having an inner layer that is fully isolated from outside contact by outer cladding layers in accordance with an embodiment.

As shown in FIG. 6A, a metal forming tool such as a stamping die tool may be used to cut and/or form metal layer(s) 24L into desired shield structures. In the example of FIG. 6A, stamping tool 60 may include dies such as upper die 60T and lower die 60L. When dies 60T and 60L are moved towards each other in directions 62, layers 24L can be formed into a desired shape for forming shield 24. A single layer 24L (e.g., a stainless steel layer or other suitable layer) may be shaped using tool 60 or multiple layers 24L may be shaped using tool 60. The outer layers among layers 24L may serve as cladding layers for one or more inner layers. These layers may be clad onto inner layer(s) 24L using cold rolling equipment 50 of FIG. 5 (e.g., before stamping) or may be clad onto inner layer(s) 24L when using stamping tool 60. As shown in FIG. 6B, shield 24 may be formed from outer cladding layers such as outer cladding layers 24LT that are larger than an inner layer such as inner layer 24LC. If, as an example, layers 24LT are rectangular and have dimensions L1×L2, layer 24LC may be formed with a smaller rectangular shape having dimensions L1'×L2', where L1'<L1 and L2'<L2. Inner layer 24LC may be cut from a layer of material using a stamping tool or other cutting equipment and may be sandwiched between outer layers 24LC and formed into shape using dies such as dies 60T and 60L of FIG. 6A. If desired, layers 24LC may be cut from larger sheets of material using dies such as dies 60T and 60L (e.g., as part of a stamping process that forms shield 24 into a desired shape or as part of a separate cutting operation). Because inner layer 24LC has smaller lateral dimensions than outer layers 24LT, lower edges 61 of shield 24 will contain only the material of outer layers 24LT and will be free of the material of inner layer 24LC (i.e., because the outer cladding layers of shield 24 are larger than the inner layer of magnetic shielding material, edge portions of the cladding layers are joined together without any intervening portions of the magnetic shielding material). This may help prevent corrosion of inner layer 24LC and enhance solderability of the lower edges of shield 24. Central region 63 of shield 24 contains inner layer 24LC, so inner layer 24LC may be used in shielding components that are overlapped by shield 24. Any suitable materials may be used in forming the inner and outer layers of shields 24 of FIGS. 6A and 6B. For example, the outer layers of shields 24 of FIGS. 6A and 6B may be formed from materials that enhance corrosion resistance and/or solderability, such as the materials used for layers 24L-1 and 24L-3 of FIG. 5 and the inner layers of shields 24 of FIGS. 6A and 6B may be formed from magnetic materials such as the materials used for layer 24L-2 of FIG. 5. If desired, other techniques for cutting and forming layer(s) of material into a desired shape for shield 24 may be used, if desired. The examples of FIGS. 5, 6A and 6B are merely illustrative.

If desired, magnetic materials or other shielding materials may be added onto a shield structure using printing (e.g., screen printing, pad printing, ink-jet printing, etc.) or other techniques. As an example, particles of magnetic material in a curable liquid resin (e.g., a curable liquid polymer) may be printed onto the upper surface of a shield can and cured (e.g., by application of heat to cure a thermally curable resin, by application of ultraviolet light to cure an ultraviolet-light-cured resin, etc.).

FIGS. 7, 8, 9, and 10 are cross-sectional side views of shield 24 in various illustrative configurations. The thicknesses of the walls of shield 24 in the illustrative configurations of FIGS. 7, 8, 9, and 10 may be 100-200 microns, more than 125 microns, less than 250 microns, or other suitable thickness.

Figure 7:
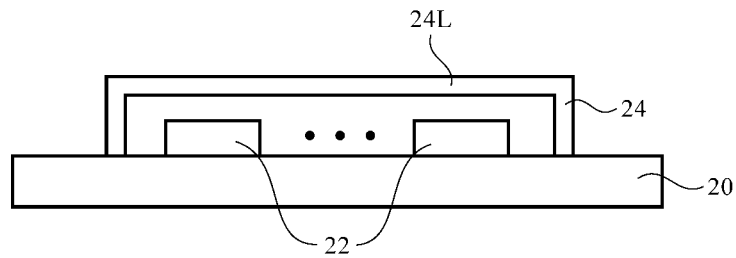
FIG. 7 is a cross-sectional side view of an illustrative shield formed from a single layer of shielding material in accordance with an embodiment.

In the configuration of FIG. 7, shield 24 has been formed from a single layer of material (layer 24L). The single layer of material may have sufficient magnetic permeability and sufficient conductivity to serve both as a magnetic flux shield and a radio-frequency electromagnetic interference shield. Layer 24L may be, for example, a stainless steel layer.

Figure 8:
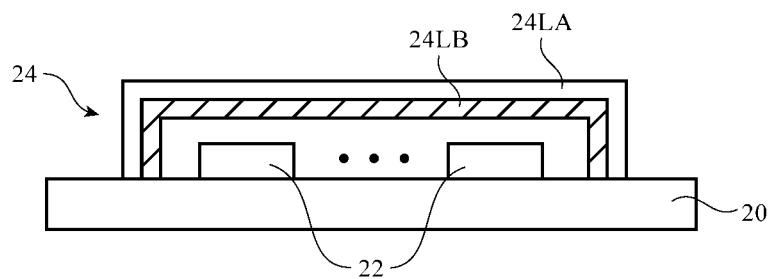
FIG. 8 is a cross-sectional side view of an illustrative shield formed from two layers of material in accordance with an embodiment.

In the arrangement of FIG. 8, a first layer (24LA) has been attached to a second layer (24LB) to form shield 24. One of layers 24LA and 24LB may have a high conductivity and the other of layers 24LA and 24LB may have a high relative permeability (i.e., one of these layers may serve as a radio-frequency shielding layer and the other of the layers may serve as a magnetic shielding layer). If desired, one of the layers may be stainless steel layer (e.g., 430 stainless steel, 444 stainless steel, other ferritic stainless steel, etc.) and the other of the layers may be formed from a material with satisfactory corrosion resistance and/or solderability (e.g., nickel, copper-nickel, gold, silver, etc.). Layers 24LA and 24LB may be rolled together using cold rolling techniques, may be stamped together, etc. Stamping equipment 60 or other equipment may be used for shaping shield 24 from layers 24L.

Figure 9:
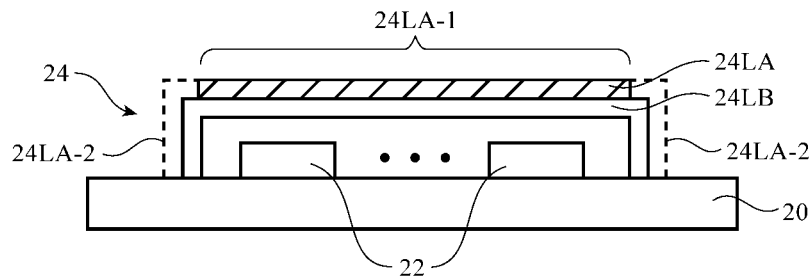
FIG. 9 is a cross-sectional side view of an illustrative shield onto which magnetic material has been incorporated using printing or other deposition techniques in accordance with an embodiment.

In the arrangement of FIG. 9, a first layer (24LA) has been printed on a second layer (24LB) to form shield 24. Any suitable printing technique or other deposition technique may be used to deposit layer 24LA on layer 24LB. Layer 24LA may be, for example, printed onto layer 24LB using screen printing, pad printing, or ink-jet printing, or may be applying using spraying, dipping, or other techniques. Layer 24LA may extend across the top and sidewalls of layer 24LB (see, e.g., central portion 24LA-1 and sidewall portions 24LA-2) or may be confined to the planar upper surface of layer 24LB (see, e.g., central portion 24LA-1). Layer 24LB may be a stainless steel layer that can block magnetic flux while providing electromagnetic radio-frequency shielding or may be a high-conductivity metal radio-frequency electromagnetic shielding layer. Layer 24LA may be a layer of magnetic material that can serve as a magnetic shield (i.e., layer 24LA can block magnetic flux and may have a relative permeability of 500 or more 1000 or more, or other suitable value).

Figure 10:
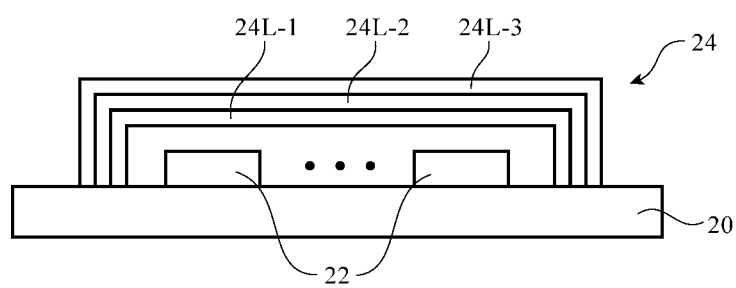
FIG. 10 is a cross-sectional side view of an illustrative shield having three layers of shielding material in accordance with an embodiment.

FIG. 10 is a cross-sectional side view of an illustrative shield having three layers of material. As shown in FIG. 10, shield 24 may include first layer 24L-1, second layer 24L-2, and third layer 24L-3. Layer 24L-2 may be a magnetic shielding layer such as a layer of stainless steel and outer layers 24L-1 and 24L-3 may be layers of nickel, copper-nickel, silver, gold or other materials that enhance solderability and corrosion resistance. Outer layers 24L-1 and 24L-3 may be cold-rolled or stamped cladding layers, may be electroplated coatings or coatings deposited using physical vapor deposition, or may be other outer layers. If desired, inner layer 24L-2 may be formed using multiple sublayers (e.g., a high conductivity electromagnetic interference shielding layer and a magnetic shielding layer formed from a magnetic material). Configurations with additional layers may also be used in forming shield 24. The configuration of FIG. 10 is merely illustrative.

Figure 11:
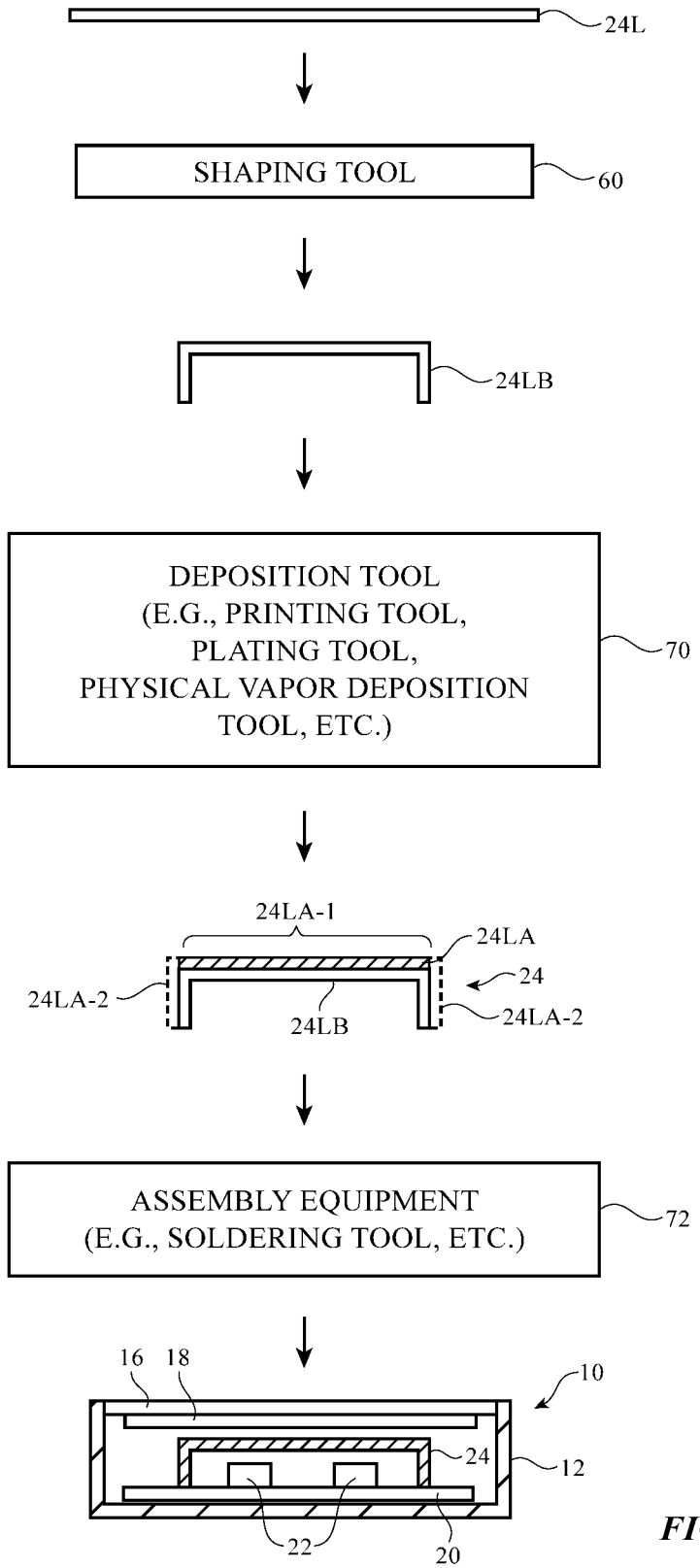
FIG. 11 is a diagram of illustrative equipment for forming shielding structures in accordance with an embodiment.

FIG. 11 shows illustrative operations involved in fabricating a device with shielded components. Initially, one or more layers 24L of material may be shaped using shaping tool 60 (e.g., a press or other tool such as stamping tool 60 of FIG. 6A) to form shaped layer(s) 24LB. Layer(s) 24LB may include one or more radio-frequency shielding layers, one or more magnetic shielding layers, one or more layers that serve both as radio-frequency shielding layers and magnetic shielding layers, one or more corrosion resistance and/or solderability enhancement layers, and/or other layer(s) of material.

Shaped layer 24LB may be processed using deposition equipment such as deposition tool 70 to form shield 24. Tool 70 may deposit optional additional layer(s) of material such as layer 24LA on one or both sides of layer 24LB using printing (e.g., printing of magnetic material on central region 24LA-1 and/or side regions 24LA-2), using electrochemical deposition (plating), using physical vapor deposition, or using other deposition techniques. The additional layer(s) 24A may be corrosion resistance layers (e.g., nickel, copper-nickel etc.), may be layers of gold, silver, or other high conductivity and/or corrosion resistance materials, and or may be other materials (e.g., magnetic materials). Configurations in which layer 24LB is formed from multiple cold-rolled layers (see, e.g., FIG. 5) and/or multiple layers that have been stamped together using equipment such as tool 60 of FIG. 6A or other equipment, may also be used.

After forming shield 24, equipment 72 may be used to mount shield 24 on substrate 20 to shield electrical components 22 and to assemble substrate 20 with other structures in housing 12 to form device 10. Equipment 72 may include surface mount technology (SMT) soldering equipment and other equipment for attaching shield 24 and components 22 to substrate 20, computer-controlled equipment for assembling display cover layer 16 and display module 18 in housing 12, and other equipment for assembling device 10.

The foregoing is merely illustrative and various modifications can be made by those skilled in the art without departing from the scope and spirit of the described embodiments. The foregoing embodiments may be implemented individually or in any combination.

What is claimed is:
1. Apparatus, comprising:
   a substrate;
   at least one electrical component mounted on the substrate; and a shielding can attached to the substrate that covers and shields the electrical component, wherein the shielding can includes a plurality of layers of material including a layer of magnetic shielding material, the plurality of layers of material include first and second cladding layers on opposing sides of the layer of magnetic shielding material, the first and second cladding layers are larger than the layer of magnetic shielding material, edge portions of the first and second cladding layers are joined together without any intervening portions of the magnetic shielding material, and the edge portions of the first and second cladding layers are mounted on the substrate.

2. The apparatus defined in claim 1 wherein the layer of magnetic shielding material has a relative permeability of at least 500.

3. The apparatus defined in claim 1 wherein the layer of magnetic shielding material has a relative permeability of at least 1000.

4. The apparatus defined in claim 1 wherein at least one of the first and second cladding layers is a radio-frequency electromagnetic interference shielding layer.

5. The apparatus defined in claim 4 wherein the radio-frequency electromagnetic interference shielding layer is a metal layer.

6. The apparatus defined in claim 5 wherein the metal layer has a resistivity of less than $3 \times 10^8$ ohm-m.

7. The apparatus defined in claim 6 wherein the layer of magnetic shielding material is a printed layer of magnetic material on the metal layer.

8. The apparatus defined in claim 6 wherein the metal layer is a cold-rolled cladding layer on the layer of magnetic shielding material.

9. The apparatus defined in claim 8 wherein the layer of magnetic shielding material comprises a layer of stainless steel.

10. The apparatus defined in claim 9 wherein the stainless steel comprises a stainless steel selected form the group consisting of: 430 stainless steel and 444 stainless steel.

11. The apparatus defined in claim 6 wherein the layer of magnetic shielding material and the metal layer are stamped together and form walls for the shielding can.

12. The apparatus defined in claim 1 wherein the layer of magnetic shielding material comprises stainless steel.

13. The apparatus defined in claim 1 wherein the first and second cladding layers comprise a material selected from the group consisting of: nickel, gold, silver, and copper-nickel.

14. The apparatus defined in claim 1 wherein the edge portions of the first and second cladding layers are parallel to the layer of magnetic shielding material.

15. The apparatus defined in claim 1 wherein the layer of magnetic shielding material is a layer of stainless steel and the first and second cladding layers encapsulate the layer of stainless steel.

16. Shielded circuitry, comprising:
a support structure;
electrical components soldered to the support structure; and
a shielding structure that shields the electrical components and that is soldered to the support structure, wherein the shielding structure comprises a stainless steel layer with opposing first and second surfaces, the stainless steel layer has a first length, a first cladding layer on the first surface, and a second cladding layer on the second surface, the first and second cladding layers have second and third lengths that are longer than the first length, the first and second cladding layers extend beyond the stainless steel layer, and edge portions of the first and second cladding layers are joined together without any intervening portions of the stainless steel layer.

17. The shielded circuitry defined in claim 16 wherein the stainless steel layer has a relative permeability of at least 500.

18. The shielded circuitry defined in claim 16 wherein the stainless steel comprises a stainless steel selected from the group consisting of: 430 stainless steel and 444 stainless steel.

19. The shielded circuitry defined in claim 16 wherein the cladding layers comprise a metal with more solderability than the stainless steel layer.

20. The shielded circuitry defined in claim 16 wherein the shielding structure comprises a cowling that holds the electrical components to the support structure.

* * * * *